US012412785B2

(12) United States Patent
Yang

(10) Patent No.: US 12,412,785 B2
(45) Date of Patent: Sep. 9, 2025

(54) SEMICONDUCTOR STRUCTURE HAVING CONTACT PLUG AND METHOD OF MANUFACTURING THE SAME

(71) Applicant: NANYA TECHNOLOGY CORPORATION, New Taipei (TW)

(72) Inventor: Zih-Hong Yang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 657 days.

(21) Appl. No.: 17/687,837

(22) Filed: Mar. 7, 2022

(65) Prior Publication Data
US 2023/0282515 A1 Sep. 7, 2023

(51) Int. Cl.
H01L 21/768 (2006.01)
H01L 23/528 (2006.01)
H01L 23/532 (2006.01)

(52) U.S. Cl.
CPC .... H01L 21/76897 (2013.01); H01L 21/7684 (2013.01); H01L 21/76877 (2013.01);
(Continued)

(58) Field of Classification Search
CPC ........... H01L 21/76838; H01L 21/7684; H01L 23/52; H01L 23/522; H01L 21/74; H01L 21/743; H01L 21/76804; H01L 21/76805; H01L 21/76877; H01L 21/76879; H01L 21/32115; H01L 21/3212; H01L 23/53295; H01L 23/5329; H01L 21/76841;
(Continued)

(56) References Cited

U.S. PATENT DOCUMENTS 9,293,172 B2 3/2016 Lee et al.
2005/0287803 A1* 12/2005 Lee .................. H01L 21/76847
257/E23.152
(Continued)

FOREIGN PATENT DOCUMENTS

CN 1107969 C 5/2003
CN 103377905 A 10/2013
(Continued)

OTHER PUBLICATIONS

Office Action and Search Report mailed on Mar. 24, 2023 related to Taiwanese Application No. 111150633.
(Continued)

Primary Examiner — Britt D Hanley
(74) Attorney, Agent, or Firm — Xuan Zhang

(57) ABSTRACT

A semiconductor structure and a method of manufacturing a semiconductor structure are provided. The method includes forming an insulation structure over a semiconductor substrate, the insulation structure defining a trench having a trench width. The method also includes forming a first conductive material layer in the trench and over an upper surface of the insulation structure, wherein a portion of the first conductive material layer over the upper surface of the insulation structure has a thickness of greater than half the trench width. The method further includes performing a planarization operation on the first conductive material layer to form a contact plug having a concave upper surface recessed from the upper surface of the insulation structure.

11 Claims, 12 Drawing Sheets

(52) U.S. Cl.
CPC ...... *H01L 23/528* (2013.01); *H01L 23/53223* (2013.01); *H01L 23/53238* (2013.01)

(58) Field of Classification Search
CPC ....... H01L 21/76843; H01L 2221/1073; H01L 2221/1078
See application file for complete search history.

(56) References Cited

U.S. PATENT DOCUMENTS

| | | | | |
|---|---|---|---|---|
| 2007/0029611 | A1* | 2/2007 | Phan | H01L 21/76838 438/149 |
| 2008/0150142 | A1* | 6/2008 | Saito | H01L 21/76883 257/E23.141 |
| 2008/0303074 | A1 | 12/2008 | Noda | |
| 2011/0121403 | A1 | 5/2011 | Lee et al. | |
| 2017/0141216 | A1 | 5/2017 | Abe et al. | |
| 2017/0194201 | A1* | 7/2017 | Fu | H01L 21/76883 |
| 2019/0252320 | A1 | 8/2019 | Liang | |
| 2020/0227314 | A1* | 7/2020 | Kim | H01L 23/53295 |

FOREIGN PATENT DOCUMENTS

| | | |
|---|---|---|
| CN | 108231727 A | 6/2018 |
| DE | 112021003392 T5 | 4/2023 |
| JP | 2013232447 A | 11/2013 |
| TW | 202023020 A | 6/2020 |
| TW | 202133437 A | 9/2021 |
| TW | 202209569 A | 3/2022 |

OTHER PUBLICATIONS

Office Action and Search Report mailed on May 22, 2023 related to Taiwanese Application No. 111133167.
Office Action and and the search report mailed on Dec. 3, 2024 related to U.S. Appl. No. 17/688,071.
English Translation of CN103377905A.
English Translation of CN108231727A.
English Translation of DE112021003392T5.
English Translation of JP2013232447A.
Office Action and and the search report mailed on Mar. 7, 2025 related to U.S. Appl. No. 17/688,071.
Translation of abstract of the foreign reference JP2013232447A.
Translation of the foreign reference JP2013232447A.

* cited by examiner

SEMICONDUCTOR STRUCTURE HAVING CONTACT PLUG AND METHOD OF MANUFACTURING THE SAME

TECHNICAL FIELD

The present disclosure relates to a semiconductor structure and a method of manufacturing the same, and more particularly, to a semiconductor structure having a contact plug, and a method of manufacturing the same.

DISCUSSION OF THE BACKGROUND

Semiconductor devices are used in a variety of electronic applications, such as personal computers, cell phones, digital cameras, and other electronic equipment. The dimensions of semiconductor devices are continuously being scaled down to meet the increasing is demands of computing abilities. However, a variety of issues arise during the scaling-down process and thereby impact the final electrical characteristics, quality, and yield. Therefore, challenges remain in achieving improved quality, yield, and reliability.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor structure. The semiconductor structure includes a semiconductor substrate, an insulation structure, a first contact plug, and an interconnection structure. The semiconductor substrate has an upper surface. The insulation structure is over the upper surface of the semiconductor substrate. The first contact plug passes through the insulation structure and has a concave upper surface recessed from an upper surface of the insulation structure. The interconnection layer directly contacts the concave upper surface of the first contact plug.

Another aspect of the present disclosure provides a method of manufacturing a semiconductor structure. The method includes forming an insulation structure over a semiconductor substrate, the insulation structure defining a trench having a trench width. The method also includes forming a first conductive material layer in the trench and over an upper surface of the insulation structure, wherein a portion of the first conductive material layer over the upper surface of the insulation structure has a thickness of greater than half the trench width. The method further includes performing a planarization operation on the first conductive material layer to form a contact plug having a concave upper surface recessed from the upper surface of the insulation structure.

Another aspect of the present disclosure provides a method of manufacturing a semiconductor structure. The method includes forming an insulation structure over a semiconductor substrate, the insulation structure defining a trench. The method also includes forming a titanium nitride layer on an inner wall of the trench and over an upper surface of the insulation structure. The method further includes forming a first conductive material layer in the trench and over the titanium nitride layer, wherein a portion of the first conductive material layer over an upper surface of the insulation structure has a thickness of greater than about three times a thickness of the titanium nitride layer. The method also includes performing a planarization operation on the first conductive material layer to form a contact plug having a concave upper surface recessed from the upper surface of the insulation structure.

In the method of manufacturing the semiconductor structure, with the design of the thickness of a portion of a conductive material layer over an upper surface of an insulation structure, the provided amount of the conductive material layer can be sufficient to sustain the dishing effect caused by a subsequent planarization operation, and thus the recess extent of the resulted concave upper surface of a contact plug formed of the conductive material layer can be minimized. Therefore, a void or a gap which could have been formed between the contact plug and an interconnection layer due to a deep recess formed on an upper surface of the contact plug can be prevented, and thus a satisfactory electrical connection between the contact plug and the interconnection layer can be achieved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
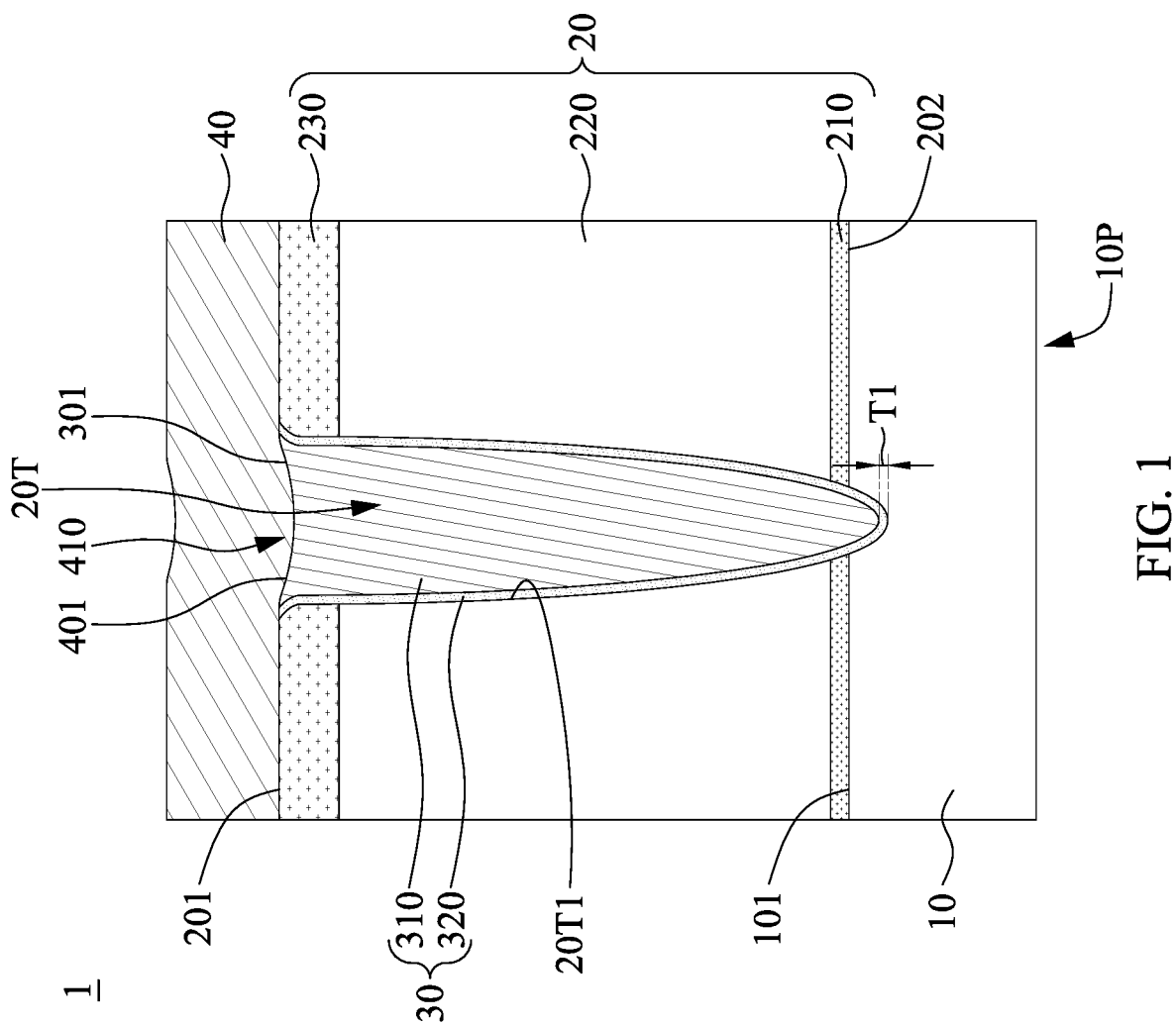
FIG. 1 is a schematic view of a semiconductor structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic view of a semiconductor structure 1, in accordance with some embodiments of the present disclosure. The semiconductor structure 1 includes a semiconductor substrate 10, an insulation structure 20, a contact plug 30, and an interconnection structure 40.

The semiconductor structure 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

In some embodiments, the semiconductor structure 10 includes a peripheral region 10P and an array region (not shown in FIG. 1). In some embodiments, the semiconductor structure 10 may include one or more active regions defined by one or more isolation structures (not shown in FIG. 1). In some embodiments, the semiconductor substrate 10 has an upper surface 101.

The insulation structure 20 may be disposed or formed over the upper surface 101 of the semiconductor substrate 10. In some embodiments, the insulation structure 20 defines a trench 20T. In some embodiments, the trench 20T extends from an upper surface 201 of the insulation structure 20 to a bottom surface 202 of the insulation structure 20. In some embodiments, the trench 20T extends into a portion of the semiconductor substrate 10. In some embodiments, the trench 20T extends into a portion of the active region of the semiconductor substrate 10. In some embodiments, the trench 20T extends into a portion of the peripheral region 10P of the semiconductor substrate 10.

In some embodiments, the insulation structure 20 include insulation layers 210, 220, and 230. In some embodiments, the trench 20T passes through the insulation layers 210, 220, and 230.

In some embodiments, the insulation layer 210 is disposed or formed on the upper surface 101 of the semiconductor substrate 101. In some embodiments, the insulation layer 210 may be formed as a stacked layer or a single layer including silicon oxide, silicon nitride, silicon oxynitride, silicon nitride oxide, fluoride-doped silicate, or the like. In some embodiments, the insulation layer 210 may be or include silicon nitride. In some embodiments, the insulation layer 210 has a thickness from about 5 nm to about 10 nm. In some embodiments, the insulation layer 210 has a thickness from about 5.5 nm to about 8 nm.

In some embodiments, the insulation layer 220 is disposed or formed on the insulation layer 210. In some embodiments, the insulation layer 220 may be formed as a stacked layer or a single layer including silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto. In some embodiments, the insulation layer 220 may be or include a spin-on dielectric (SOD) layer. In some embodiments, the insulation layer 220 may be or include silicon oxide. In some embodiments, the insulation layer 220 has a thickness from about 80 nm to about 120 nm. In some embodiments, the insulation layer 220 has a thickness from about 95 nm to about 110 nm.

In some embodiments, the insulation layer 230 is disposed or formed on the insulation layer 220. In some embodiments, the insulation layer 230 may be formed as a stacked layer or a single layer including silicon oxide, silicon nitride, silicon oxynitride, silicon nitride oxide, fluoride-doped silicate, or the like. In some embodiments, the insulation layer 230 may be or include silicon nitride. In some embodiments, the insulation layer 220 has a thickness from about 10 nm to about 45 nm. In some embodiments, the insulation layer 220 has a thickness from about 15 nm to about 35 nm.

The contact plug 30 may pass through the insulation structure 20. In some embodiments, the contact plug 30 has a concave upper surface 301 recessed from the upper surface 201 of the insulation structure 20. In some embodiments, the contact plug 30 is formed in the trench 20T of the insulation structure 20. In some embodiments, the contact plug 30 is disposed over the peripheral region 10P of the semiconductor substrate 10. In some embodiments, the contact plug 30 may be formed of or include one or more conductive elements. The contact plug 30 may include doped polysilicon, metal, or a combination thereof. In some embodiments, the contact plug 30 includes aluminum, tungsten, titanium, titanium nitride, tantalum, tantalum nitride, copper, gold, platinum, cobalt, alloys thereof, silicides thereof, or any combination thereof. In some embodiments, the contact plug 30 includes a conductive layer 310 and a titanium nitride layer 320.

In some embodiments, the conductive layer 310 is filled in the trench 20T of the insulation structure 20. In some embodiments, the conductive layer 310 includes tungsten.

In some embodiments, the titanium nitride layer 320 is between the conductive layer 310 and an inner wall 20T1 of the trench 20T of the insulation structure 20. In some embodiments, the conductive layer 310 is conformally on the titanium nitride layer 320. In some embodiments, the titanium nitride layer 320 directly contacts the conductive layer 310 and the inner wall 20T1 of the trench 20T of the insulation structure 20. In some embodiments, the titanium nitride layer 320 has a thickness T1. In some embodiments, the thickness T1 of the titanium nitride layer 320 is less than about 9 nm. In some embodiments, the thickness T1 of the titanium nitride layer 320 is equal to or less than about 7 nm. In some embodiments, the thickness T1 of the titanium nitride layer 320 is equal to or less than about 6 nm. In some embodiments, the thickness T1 of the titanium nitride layer 320 is equal to or less than about 5 nm. In some embodiments, the thickness T1 of the titanium nitride layer 320 is equal to or less than about 4 nm. In some embodiments, the thickness T1 of the titanium nitride layer 320 is equal to or less than about 3 nm.

According to some embodiments, the titanium nitride layer 320 physically separates the conductive layer 310 from layers underneath and has a relatively thin thickness. Therefore, the titanium nitride layer 320 not only may serve as a barrier, but also can be provided with a relatively low resistance due to its thin thickness, which is advantageous to the conductivity and electrical connection functions of the contact plug 30.

The interconnection layer 40 may directly contact the concave upper surface 301 of the contact plug 30. In some embodiments, the interconnection layer 40 is disposed or formed on the upper surface 201 of the insulation structure 20. In some embodiments, the interconnection layer 40 may be formed of or include one or more conductive elements. In some embodiments, the interconnection layer 40 includes aluminum, copper, tungsten, cobalt, or an alloy thereof. In some embodiments, the interconnection layer 40 has a thickness from about 25 nm to about 40 nm. In some embodiments, the interconnection layer 40 has a thickness from about 30 nm to about 35 nm.

In some embodiments, the interconnection layer 40 includes a protrusion 410. The protrusion 410 of the interconnection layer 40 may extend into a portion of the trench 20T of the insulation structure 20. In some embodiments, the protrusion 410 of the interconnection layer 40 has a convex surface 401 which contacts the concave upper surface 301 of the contact plug 30. In some embodiments, the convex surface 401 of the protrusion 410 of the interconnection layer 40 is conformal with the concave upper surface 301 of the contact plug 30. In some embodiments, the interface between the convex surface 401 of the protrusion 410 of the interconnection layer 40 and the concave upper surface 301 of the contact plug 30 is within the trench 20T of the insulation structure 20.

Figure 2:
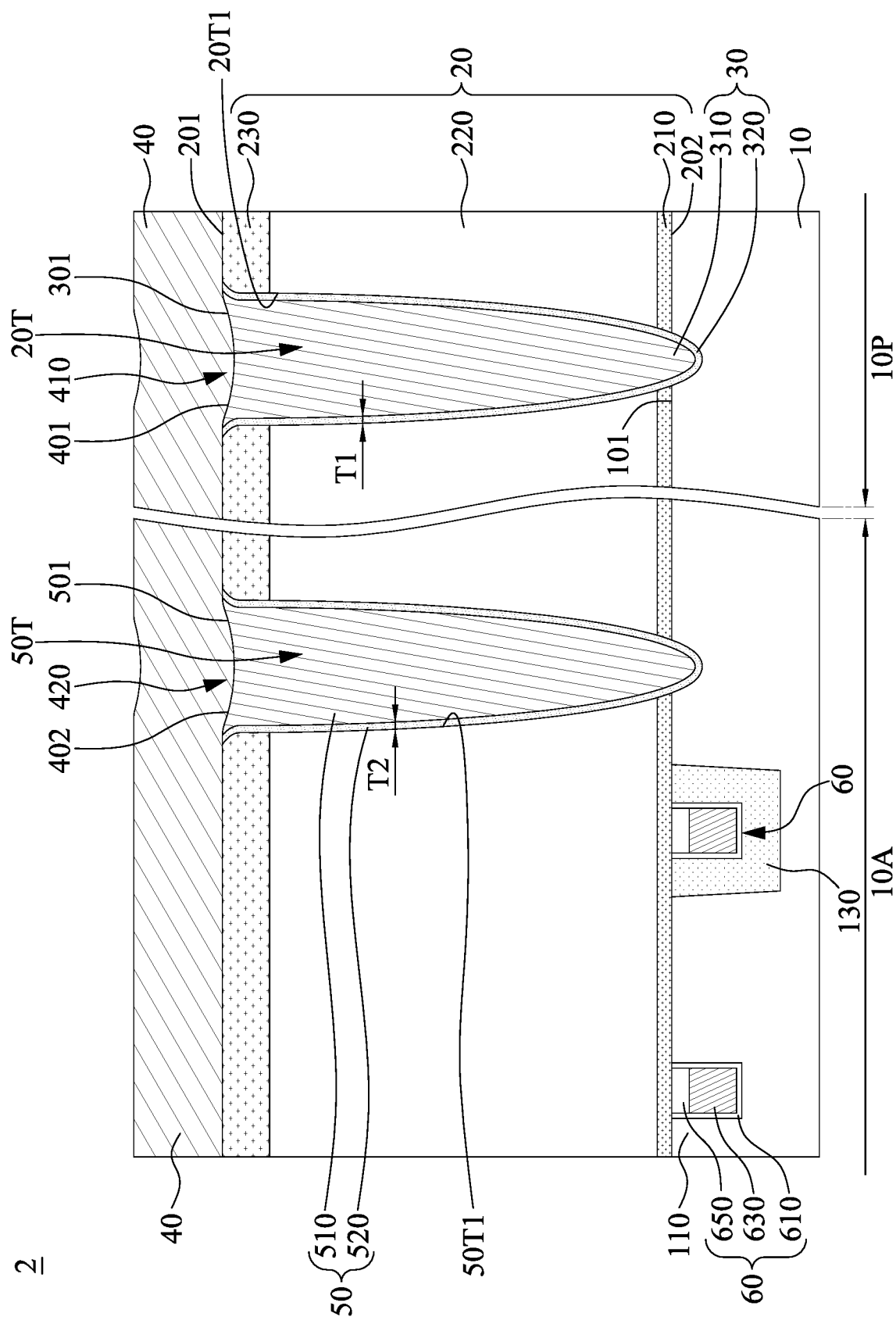
FIG. 2 is a schematic view of a semiconductor structure, in accordance with some embodiments of the present disclosure.

FIG. 2 is a schematic view of a semiconductor structure 2, in accordance with some embodiments of the present disclosure. The semiconductor structure 2 includes a semiconductor substrate 10, an insulation structure 20, contact plugs 30 and 50, an interconnection structure 40, and one or more word line structures 60.

The semiconductor structure 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

In some embodiments, the semiconductor structure 10 includes a peripheral region 10P and an array region 10A. In some embodiments, the semiconductor structure 10 may include one or more active regions 110 defined by one or more isolation structures 130. The isolation structure 130 may be formed of or include an insulating material such as silicon oxide, silicon nitride, silicon oxynitride, or a combination thereof. In some embodiments, the semiconductor substrate 10 has an upper surface 101.

The insulation structure 20 may be disposed or formed over the peripheral region 10P and the array region 10A of the semiconductor substrate 10. In some embodiments, the insulation structure 20 defines a trench 20T over the peripheral region 10P and a trench 50T over the array region 10A. In some embodiments, the trenches 20T and 50T extend from an upper surface 201 of the insulation structure 20 to a bottom surface 202 of the insulation structure 20. In some embodiments, the trenches 20T and 50T extend into portions of the semiconductor substrate 10. In some embodiments, the trench 20T extends into a portion of the peripheral region 10P of the semiconductor substrate 10. In some embodiments, the trench 50T extends into a portion of the array region 10A of the semiconductor substrate 10. In some embodiments, the trench 50T extends into a portion of the active region 110 of the semiconductor substrate 10.

In some embodiments, the insulation structure 20 include insulation layers 210, 220, and 230. In some embodiments, the trenches 20T and 50T pass through the insulation layers 210, 220, and 230.

In some embodiments, the insulation layer 210 is disposed or formed on the upper surface 101 of the semiconductor substrate 101. In some embodiments, the insulation layer 210 may be formed as a stacked layer or a single layer including silicon oxide, silicon nitride, silicon oxynitride, silicon nitride oxide, fluoride-doped silicate, or the like. In some embodiments, the insulation layer 210 may be or include silicon nitride. In some embodiments, the insulation layer 210 has a thickness from about 5 nm to about 10 nm. In some embodiments, the insulation layer 210 has a thickness from about 5.5 nm to about 8 nm.

In some embodiments, the insulation layer 220 is disposed or formed on the insulation layer 210. In some embodiments, the insulation layer 220 may be formed as a stacked layer or a single layer including silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, is parylene, bis-benzocyclobutenes, polyimide, porous polymeric material, or a combination thereof, but is not limited thereto. In some embodiments, the insulation layer 220 may be or include a spin-on dielectric (SOD) layer. In some embodiments, the insulation layer 220 may be or include silicon oxide. In some embodiments, the insulation layer 220 has a thickness from about 80 nm to about 120 nm. In some embodiments, the insulation layer 220 has a thickness from about 95 nm to about 110 nm.

In some embodiments, the insulation layer 230 is disposed or formed on the insulation layer 220. In some embodiments, the insulation layer 230 may be formed as a stacked layer or a single layer including silicon oxide, silicon nitride, silicon oxynitride, silicon nitride oxide, fluoride-doped silicate, or the like. In some embodiments, the insulation layer 230 may be or include silicon nitride. In some embodiments, the insulation layer 220 has a thickness from about 10 nm to about 45 nm. In some embodiments, the insulation layer 220 has a thickness from about 15 nm to about 35 nm.

The contact plug 30 may pass through the insulation structure 20. In some embodiments, the contact plug 30 has a concave upper surface 301 recessed from the upper surface 201 of the insulation structure 20. In some embodiments, the contact plug 30 is formed in the trench 20T of the insulation structure 20. In some embodiments, the contact plug 30 is disposed over the peripheral region 10P of the semiconductor substrate 10. In some embodiments, the contact plug 30 may be formed of or include one or more conductive elements. The contact plug 30 may include doped polysilicon, metal, or a combination thereof. In some embodiments, the contact plug 30 includes aluminum, tungsten, titanium, titanium nitride, tantalum, tantalum nitride, copper, gold, platinum, cobalt, alloys thereof, silicides thereof, or any combination thereof. In some embodiments, the contact plug 30 includes a conductive layer 310 and a titanium nitride layer 320.

In some embodiments, the conductive layer 310 is filled in the trench 20T of the insulation structure 20. In some embodiments, the conductive layer 310 includes tungsten.

In some embodiments, the titanium nitride layer 320 is between the conductive layer 310 and an inner wall 20T1 of the trench 20T of the insulation structure 20. In some embodiments, the conductive layer 310 is conformally on the titanium nitride layer 320. In some embodiments, the titanium nitride layer 320 directly contacts the conductive layer 310 and the inner wall 20T1 of the trench 20T of the insulation structure 20. In some embodiments, the titanium nitride layer has a thickness T1. In some embodiments, the thickness T1 of the titanium nitride layer 320 is less than about 9 nm. In some embodiments, the thickness T1 of the titanium nitride layer 320 is equal to or less than about 7 nm. In some embodiments, the thickness T1 of the titanium nitride layer 320 is equal to or less than about 6 nm. In some embodiments, the thickness T1 of the titanium nitride layer 320 is equal to or less than about 5 nm. In some embodiments, the thickness T1 of the titanium nitride layer 320 is equal to or less than about 4 nm. In some embodiments, the thickness T1 of the titanium nitride layer 320 is equal to or less than about 3 nm.

The interconnection layer 40 may directly contact the concave upper surface 301 of the contact plug 30. In some embodiments, the interconnection layer 40 is disposed or formed on the upper surface 201 of the insulation structure 20. In some embodiments, the is interconnection layer 40 may be formed of or include one or more conductive elements. In some embodiments, the interconnection layer 40 includes aluminum, copper, tungsten, cobalt, or an alloy thereof. In some embodiments, the interconnection layer 40 has a thickness from about 25 nm to about 40 nm. In some embodiments, the interconnection layer 40 has a thickness from about 30 nm to about 35 nm.

In some embodiments, the interconnection layer 40 includes a protrusion 410. The protrusion 410 of the interconnection layer 40 may extends into a portion of the trench 20T of the insulation structure 20. In some embodiments, the protrusion 410 of the interconnection layer 40 has a convex surface 401 which contacts the concave upper surface 301 of the contact plug 30. In some embodiments, the convex surface 401 of the protrusion 410 of the interconnection layer 40 is conformal with the concave upper surface 301 of the contact plug 30. In some embodiments, the interface between the convex surface 401 of the protrusion 410 of the interconnection layer 40 and the concave upper surface 301 of the contact plug 30 is within the trench 20T of the insulation structure 20.

The contact plug 50 may pass through the insulation structure 20. In some embodiments, the contact plug 50 has a concave upper surface 501 recessed from the upper surface 201 of the insulation structure 20. In some embodiments, the contact plug 50 is formed in the trench 50T of the insulation structure 20. In some embodiments, the contact plug 50 is disposed over the array region 10A of the semiconductor substrate 10. In some embodiments, the contact plug 50 may be formed of or include one or more conductive elements. The contact plug 50 may include doped polysilicon, metal, or a combination thereof. In some embodiments, the contact plug 50 includes aluminum, tungsten, titanium, titanium nitride, tantalum, tantalum nitride, copper, gold, platinum, cobalt, alloys thereof, silicides thereof, or any combination thereof. In some embodiments, the contact plug 50 includes a conductive layer 510 and a titanium nitride layer 520.

In some embodiments, the conductive layer 510 is filled in the trench 50T of the insulation structure 20. In some embodiments, the conductive layer 510 includes tungsten.

In some embodiments, the titanium nitride layer 520 is between the conductive layer 510 and an inner wall 50T1 of the trench 50T of the insulation structure 20. In some embodiments, the conductive layer 510 is conformally on the titanium nitride layer 520. In some embodiments, the titanium nitride layer 520 directly contacts the conductive layer 510 and the inner wall 50T1 of the trench 50T of the insulation structure 20. In some embodiments, the titanium nitride layer 520 has a thickness T2. In some embodiments, the thickness T2 of the titanium nitride layer 520 is less than about 9 nm. In some embodiments, the thickness T2 of the titanium nitride layer 520 is equal to or less than about 7 nm. In some embodiments, the thickness T2 of the titanium nitride layer 520 is equal to or less than about 6 nm. In some embodiments, the thickness T2 of the titanium nitride layer 520 is equal to or less than about 5 nm. In some embodiments, the thickness T2 of the titanium nitride layer 520 is equal to or less than about 4 nm. In some embodiments, the thickness T2 of the titanium nitride layer 520 is equal to or less than about 3 nm. In some embodiments, the thickness T1 of the titanium nitride layer 320 and the thickness T2 of the titanium nitride layer 520 may be the same or different.

According to some embodiments, the titanium nitride layer 520 physically separates the conductive layer 510 from layers underneath and has a relatively thin thickness. Therefore, the titanium nitride layer 520 not only may serve as a barrier, but also can be provided with a relatively low resistance due to its thin thickness, which is advantageous to the conductivity and electrical connection functions of the contact plug 50.

In some embodiments, the interconnection layer 40 directly contacts the concave upper surface 501 of the contact plug 50. In some embodiments, the interconnection layer 40 further includes a protrusion 420. The protrusion 420 of the interconnection layer 40 may extend into a portion of the trench 50T of the insulation structure 20. In some embodiments, the protrusion 420 of the interconnection layer 40 has a convex surface 402 which contacts the concave upper surface 501 of the contact plug 50. In some embodiments, the convex surface 402 of the protrusion 420 of the interconnection layer 40 is conformal with the concave upper surface 501 of the contact plug 50. In some embodiments, the interface between the convex surface 402 of the protrusion 420 of the interconnection layer 40 and the concave upper surface 501 of the contact plug 50 is within the trench 50T of the insulation structure 20.

In some embodiments, the contact plug 50 is electrically connected to the interconnection layer 40. In some embodiments, the contact plug 50 electrically connects to the active region 110 of the semiconductor substrate 10. In some embodiments, the contact plug 50 may electrically connect to the word line structure 60. In some embodiments, the interconnection layer 40 electrically connecting the contact plug 30 and the contact plug 50 may provide electrical is connection between elements or components over the peripheral region 10P and elements or components over the array region 10A.

In some embodiments, the word line structure 60 includes a word line insulating layer 610, a conductive layer 630, and a cap layer 650.

In some embodiments, the word line insulating layer 610 may be formed to conformally cover an inner surface of a word line trench within the semiconductor substrate 10. In some embodiments, the word line insulating layer 610 may be formed of or include, for example, silicon oxide, silicon nitride, silicon oxynitride, silicon nitride oxide, fluoride-doped silicate, or the like.

In some embodiments, the conductive layer 630 may be formed on the word line insulating layer 610 in the word line trench.

In some embodiments, the conductive layer 630 may be or include a conductive material, for example, doped polysilicon, metal, or metal silicide. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like.

In some embodiments, the cap layer 650 may be formed on the conductive layer 630 in the word line trench. An upper surface of the cap layer 650 may be at the same elevation of the upper surface 101 of the semiconductor substrate 10. The cap layer 650 may be formed as a stacked layer or a single layer. In some embodiments, the cap layer 650 may be formed of or include, for example, barium strontium titanate, lead zirconium titanate, titanium oxide, aluminum oxide, hafnium oxide, yttrium oxide, zirconium oxide, silicon oxide, silicon nitride, silicon oxynitride, silicon nitride oxide, fluoride-doped silicate, or the like.

Figure 3:
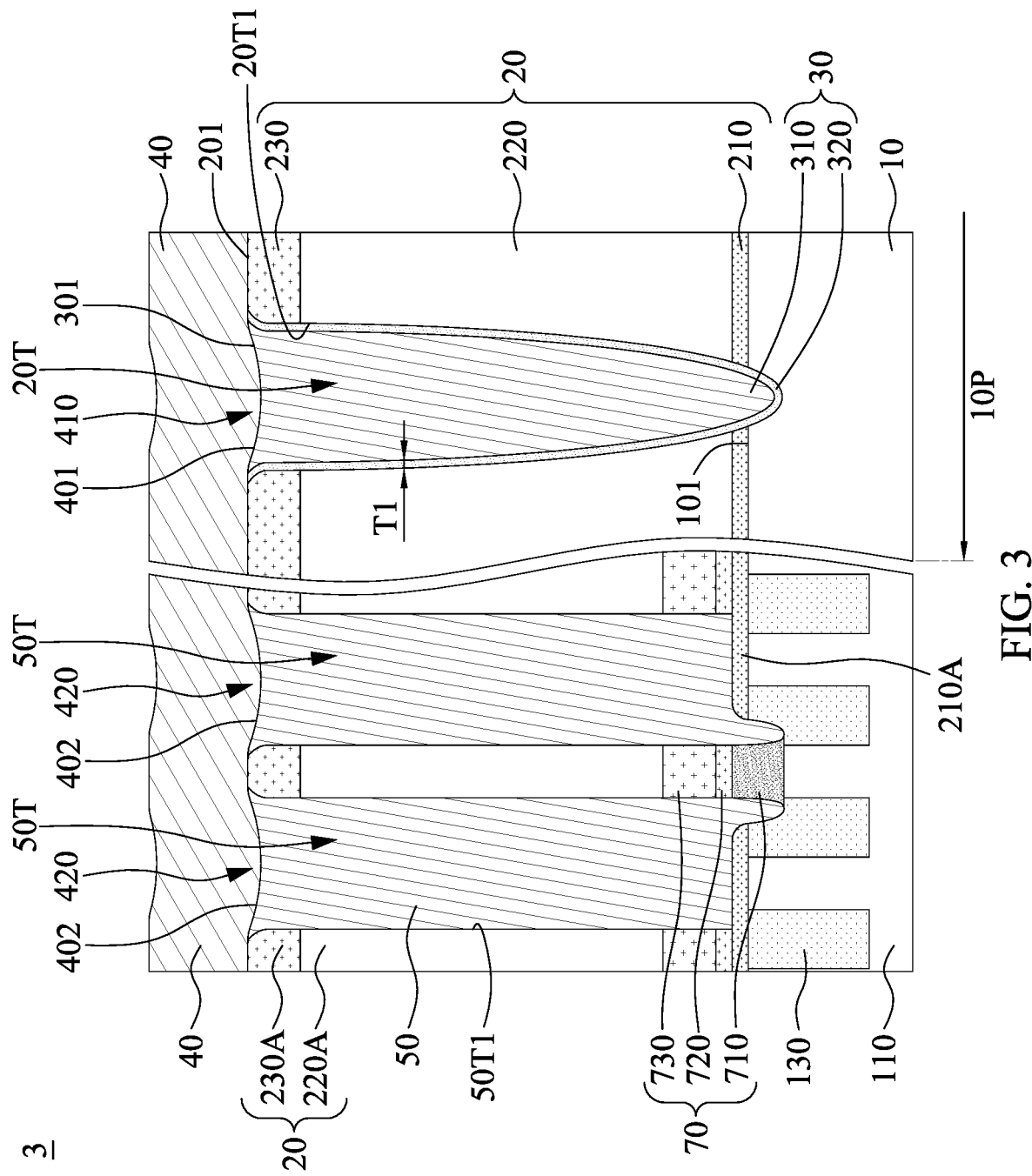
FIG. 3 is a schematic view of a semiconductor structure, in accordance with some embodiments of the present disclosure.

FIG. 3 is a schematic view of a semiconductor structure 3, in accordance with some embodiments of the present disclosure. The semiconductor structure 3 includes a semiconductor substrate 10, an insulation structure 20, contact plugs 30 and 50, an interconnection structure 40, and one or more bit line structures 70.

The semiconductor structure 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

In some embodiments, the semiconductor structure 10 includes a peripheral region 10P and an array region 10A. In some embodiments, the semiconductor structure 10 may include one or more active regions 110 defined by one or more isolation structures 130. The isolation structure 130 may be formed of or include an insulating material such as silicon oxide, silicon nitride, silicon oxynitride, or a combination thereof. In some embodiments, the semiconductor substrate 10 has an upper surface 101.

The insulation structure 20 may be disposed or formed over the peripheral region 10P and the array region 10A of the semiconductor substrate 10. In some embodiments, the insulation structure 20 defines a trench 20T over the peripheral region 10P and a trench 50T over the array region 10A. In some embodiments, the trenches 20T and 50T extend from an upper surface 201 of the insulation structure 20 to a bottom surface 202 of the insulation structure 20. In some embodiments, the trenches 20T and 50T extend into portions of the semiconductor substrate 10. In some embodiments, the trench 20T extends into a portion of the peripheral region 10P of the semiconductor substrate 10. In some embodiments, the trench 50T extends into a portion of the array region 10A of the semiconductor substrate 10. In some embodiments, the trench 50T extends into a portion of the active region 110 of the semiconductor substrate 10.

In some embodiments, the insulation structure 20 include insulation layers 210, 220, and 230. In some embodiments, the trenches 20T and 50T pass through the insulation layers 210, 220, and 230.

In some embodiments, the insulation layer 210 is disposed or formed on the upper surface 101 of the semiconductor substrate 101. In some embodiments, the insulation layer 210 may be formed as a stacked layer or a single layer including silicon oxide, silicon nitride, silicon oxynitride, silicon nitride oxide, fluoride-doped silicate, or the like. In some embodiments, the insulation layer 210 may be or include silicon nitride. In some embodiments, the insulation layer 210 has a thickness from about 5 nm to about 10 nm. In some embodiments, the insulation layer 210 has a thickness from about 5.5 nm to about 8 nm.

In some embodiments, the insulation layer 220 is disposed or formed on the insulation layer 210. In some embodiments, the insulation layer 220 may be formed as a stacked layer or a single layer including silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto. In some embodiments, the insulation layer 220 may be or include a spin-on dielectric (SOD) layer. In some embodiments, the insulation layer 220 may be or include silicon oxide. In some embodiments, the insulation layer 220 has a thickness from about 80 nm to about 120 nm. In some embodiments, the insulation layer 220 has a thickness from about 95 nm to about 110 nm.

In some embodiments, the insulation layer 230 is disposed or formed on the insulation layer 220. In some embodiments, the insulation layer 230 may be formed as a stacked layer or a single layer including silicon oxide, silicon nitride, silicon oxynitride, silicon nitride oxide, fluoride-doped silicate, or the like. In some embodiments, the insulation layer 230 may be or include silicon nitride. In some embodiments, the insulation layer 220 has a thickness from about 10 nm to about 45 nm. In some embodiments, the insulation layer 220 has a thickness from about 15 nm to about 35 nm.

The contact plug 30 may pass through the insulation structure 20. In some embodiments, the contact plug 30 has a concave upper surface 301 recessed from the upper surface 201 of the insulation structure 20. In some embodiments, the contact plug 30 is formed in the trench 20T of the insulation structure 20. In some embodiments, the contact plug 30 is disposed over the peripheral region 10P of the semiconductor substrate 10. In some embodiments, the contact plug 30 may be formed of or include one or more conductive elements. The contact plug 30 may include doped polysilicon, metal, or a combination thereof. In some embodiments, the contact plug 30 includes aluminum, tungsten, titanium, titanium nitride, tantalum, tantalum nitride, copper, gold, platinum, cobalt, alloys thereof, silicides thereof, or any combination thereof. In some embodiments, the contact plug 30 includes a conductive layer 310 and a titanium nitride layer 320.

In some embodiments, the conductive layer 310 is filled in the trench 20T of the insulation structure 20. In some embodiments, the conductive layer 310 includes tungsten.

In some embodiments, the titanium nitride layer 320 is between the conductive layer 310 and an inner wall 20T1 of the trench 20T of the insulation structure 20. In some embodiments, the conductive layer 310 is conformally on the titanium nitride layer 320. In some embodiments, the titanium nitride layer 320 directly contacts the conductive layer 310 and the inner wall 20T1 of the trench 20T of the insulation structure 20. In some embodiments, the titanium nitride layer has a thickness T1. In some embodiments, the thickness T1 of the titanium nitride layer 320 is less than about 9 nm. In some embodiments, the thickness T1 of the titanium nitride layer 320 is equal to or less than about 7 nm. In some embodiments, the thickness T1 of the titanium nitride layer 320 is equal to or less than about 6 nm. In some embodiments, the thickness T1 of the titanium nitride layer 320 is equal to or less than about 5 nm. In some embodiments, the thickness T1 of the titanium nitride layer 320 is equal to or less than about 4 nm. In some embodiments, the thickness T1 of the titanium nitride layer 320 is equal to or less than about 3 nm.

The interconnection layer 40 may directly contact the concave upper surface 301 of the contact plug 30. In some embodiments, the is interconnection layer 40 is disposed or formed on the upper surface 201 of the insulation structure 20. In some embodiments, the interconnection layer 40 may be formed of or include one or more conductive elements. In some embodiments, the interconnection layer 40 includes aluminum, copper, tungsten, cobalt, or an alloy thereof. In some embodiments, the interconnection layer 40 has a thickness from about 25 nm to about 40 nm. In some embodiments, the interconnection layer 40 has a thickness from about 30 nm to about 35 nm.

In some embodiments, the interconnection layer 40 includes a protrusion 410. The protrusion 410 of the interconnection layer 40 may extends into a portion of the trench 20T of the insulation structure 20. In some embodiments, the protrusion 410 of the interconnection layer 40 has a convex surface 401 which contacts the concave upper surface 301 of the contact plug 30. In some embodiments, the convex surface 401 of the protrusion 410 of the interconnection layer 40 is conformal with the concave upper surface 301 of the contact plug 30. In some embodiments, the interface between the convex surface 401 of the protrusion 410 of the interconnection layer 40 and the concave upper surface 301 of the contact plug 30 is within the trench 20T of the insulation structure 20.

The contact plug 50 may pass through the insulation structure 20. In some embodiments, the contact plug 50 has a concave upper surface 501 recessed from the upper surface 201 of the insulation structure 20. In some embodiments, the contact plug 50 is formed in the trench 50T of the insulation structure 20. In some embodiments, the contact plug 50 is disposed over the array region 10A of the semiconductor substrate 10. In some embodiments, the contact plug 50 may be formed of or include one or more conductive elements. The contact plug 50 may include doped polysilicon, metal, or a combination thereof. In some embodiments, the contact plug 50 includes aluminum, tungsten, titanium, titanium nitride, tantalum, tantalum nitride, copper, gold, platinum, cobalt, alloys thereof, silicides thereof, or any combination thereof.

In some embodiments, the contact plug 50 includes a conductive layer filled in the trench 50T of the insulation structure 20. In some embodiments, the conductive plug 50 includes tungsten. In some embodiments, the contact plug 50 may include a conductive layer and a titanium nitride layer (not shown in FIG. 3) between the conductive layer and an inner wall 50T1 of the trench 50T.

In some embodiments, the interconnection layer 40 directly contacts the concave upper surface 501 of the contact plug 50. In some embodiments, the interconnection layer 40 further includes a protrusion 420. The protrusion 420 of the interconnection layer 40 may extend into a portion of the trench 50T of the insulation structure 20. In some embodiments, the protrusion 420 of the interconnection layer 40 has a convex surface 402 which contacts the concave upper surface 501 of the contact plug 50. In some embodiments, the convex surface 402 of the protrusion 420 of the interconnection layer 40 is conformal with the concave upper surface 501 of the contact plug 50. In some embodiments, the interface between the convex surface 402 of the protrusion 420 of the interconnection layer 40 and the concave upper surface 501 of the contact plug 50 is within the trench 50T of the insulation structure 20.

In some embodiments, the contact plug 50 is electrically connected to the interconnection layer 40. In some embodiments, the contact plug 50 electrically connects to the active region 110 of the semiconductor substrate 10. In some embodiments, the contact plug 50 may electrically connect to the bit line structure 70. In some embodiments, the interconnection layer 40 electrically connecting the contact plug 30 and the contact plug 50 may provide electrical connection between elements or components over the peripheral region 10P and elements or components over the array region 10A.

In some embodiments, the bit line structure 70 includes a bit line contact 710 and conductive layers 720 and 730. In some embodiments, the combination of the conductive layers 720 and 730 serves as a bit line.

In some embodiments, the bit line contact 710 is formed in an opening defined by the active region 110 and the isolation structures 130 of the semiconductor substrate 10. The bit line contact 710 may include a conductive material, for example, doped polysilicon, a metal, or a metal silicide. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like. The bit line contact 710 may be electrically connected to the conductive plug 50.

In some embodiments, the conductive layer 720 is disposed or formed on the bit line contact 710. The conductive layer 720 may be formed of, for example, polysilicon or titanium nitride.

In some embodiments, the conductive layer 730 is disposed or formed on the conductive layer 730. The conductive layer 730 may be formed of, for example, copper, nickel, cobalt, aluminum, or tungsten.

FIG. 4A, FIG. 4B, FIG. 4C, FIG. 4D, FIG. 4E, FIG. 4F, and FIG. 4G illustrate various stages of a method of manufacturing a semiconductor structure 1, in accordance with some embodiments of the present disclosure.

Figure 4A:
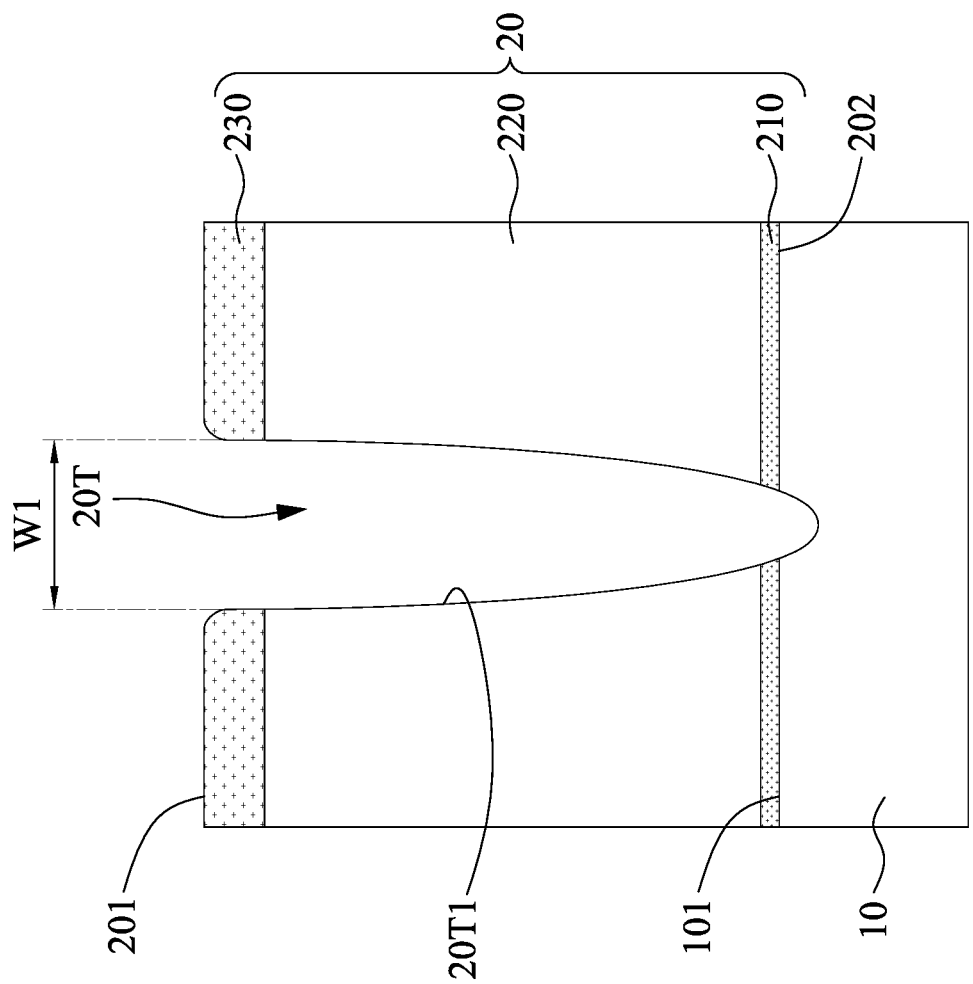
FIG. 4A illustrates one stage of a method of manufacturing a semiconductor structure, in accordance with some embodiments of the present disclosure.

Referring to FIG. 4A, an insulation structure 20 may be formed over a semiconductor substrate 10. In some embodiments, the insulation structure 20 defines a trench 20T having a trench width W1. In some embodiments, the trench 20T may be formed by performing one or more etching operations.

In some embodiments, the trench width W1 may refer to an average trench width. In some embodiments, the trench width W1 may refer to a minimum trench width. In some embodiments, the trench width W1 may refer to a maximum trench width. In some embodiments, the trench width W1 refers to a width of the opening of the trench 20T. In some embodiments, the trench width W1 of the trench 20T of the insulation structure 20 is greater than about 32 nm. In some embodiments, the trench width W1 of the trench 20T of the insulation structure 20 is from about 35 nm to about 50 nm. In some embodiments, the trench width W1 of the trench 20T of the insulation structure 20 is from about 40 nm to about 46 nm.

Figure 4B:
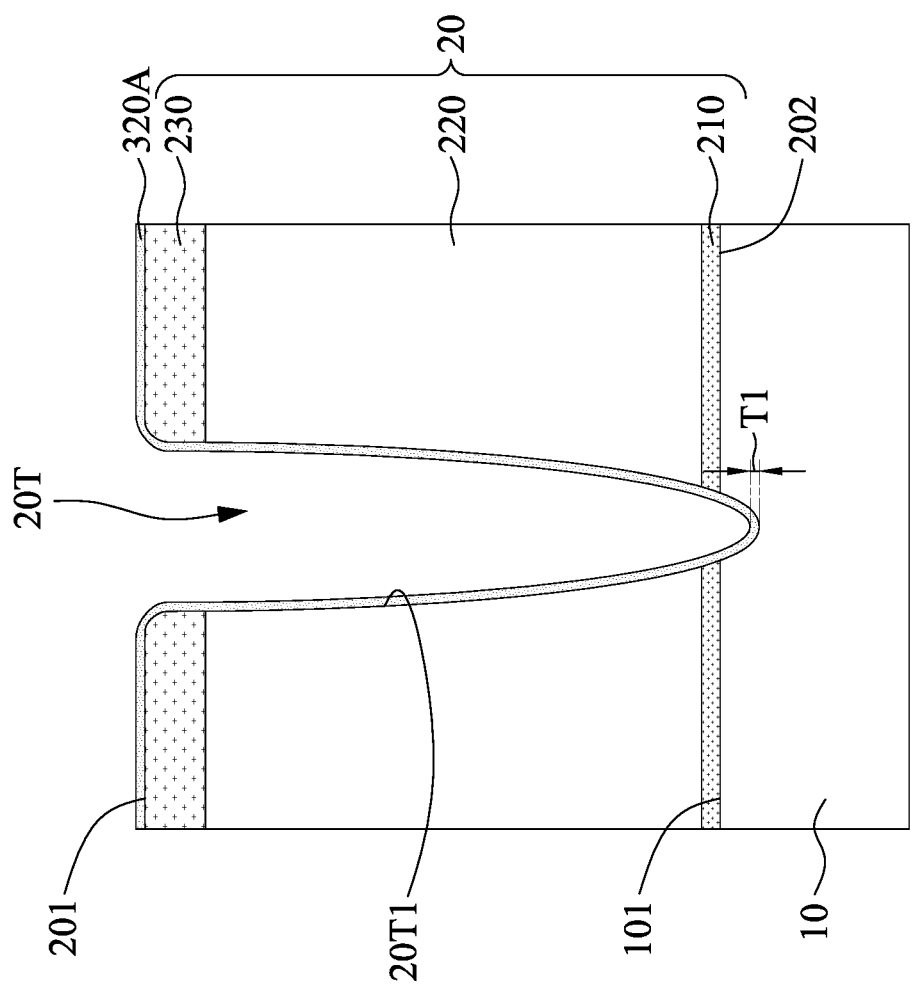
FIG. 4B illustrates one stage of a method of manufacturing a semiconductor structure, in accordance with some embodiments of the present disclosure.

Referring to FIG. 4B, a titanium nitride layer 320A may be formed on an inner wall 20T1 of the trench 20T. In some embodiments, the titanium nitride layer 320A is formed on the inner wall 20T1 of the trench 20T and over an upper surface 201 of the insulation structure 20. In some embodiments, the titanium nitride layer 320A has a thickness T1 of less than about 9 nm. In some embodiments, the thickness T1 of the titanium nitride layer 320A is equal to or less than about 7 nm. In some embodiments, the thickness T1 of the titanium nitride layer 320A is equal to or less than about 6 nm. In some embodiments, the thickness T1 of the titanium nitride layer 320A is equal to or less than about 5 nm. In some embodiments, the thickness T1 of the titanium nitride layer 320A is equal to or less than about 4 nm. In some embodiments, the thickness T1 of the titanium nitride layer 320A is equal to or less than about 3 nm. In some embodiments, the titanium nitride layer 320A is formed by a chemical vapor deposition (CVD) operation.

According to some embodiments of the present disclosure, the thickness T1 of the titanium nitride layer 320A is relatively thin, and thus the resistance of the subsequently formed contact plug 30 can be provided with a minimum satisfactory value. The thickness T1 of the titanium nitride layer 320A may be as thin as possible as long as it can still provide sufficient barrier function.

Figure 4C:
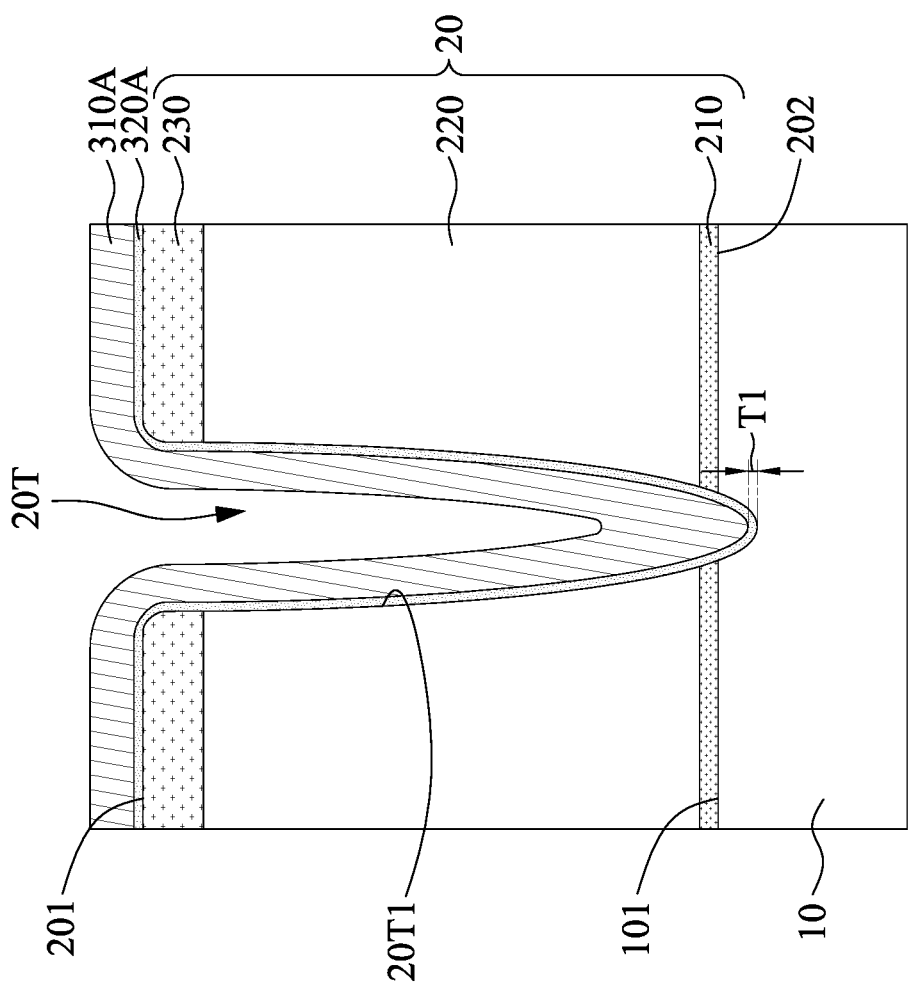
FIG. 4C illustrates one stage of a method of manufacturing a semiconductor structure, in accordance with some embodiments of the present disclosure.

Referring to FIG. 4C, a conductive material layer 310A may be formed on the titanium nitride layer 320A. In some embodiments, the conductive material layer 310A is conformally formed on the titanium nitride layer 320A. In some embodiments, the conductive material layer 310A is further formed over the upper surface 201 of the insulation structure 20. In some embodiments, the conductive material layer 310A may be or include doped polysilicon, aluminum, tungsten, copper, gold, platinum, cobalt, alloys thereof, or any combination thereof. In some embodiments, the conductive material layer 310A is formed of tungsten. In some embodiments, the conductive material layer 310A is formed by a chemical vapor deposition (CVD) operation.

Figure 4D:
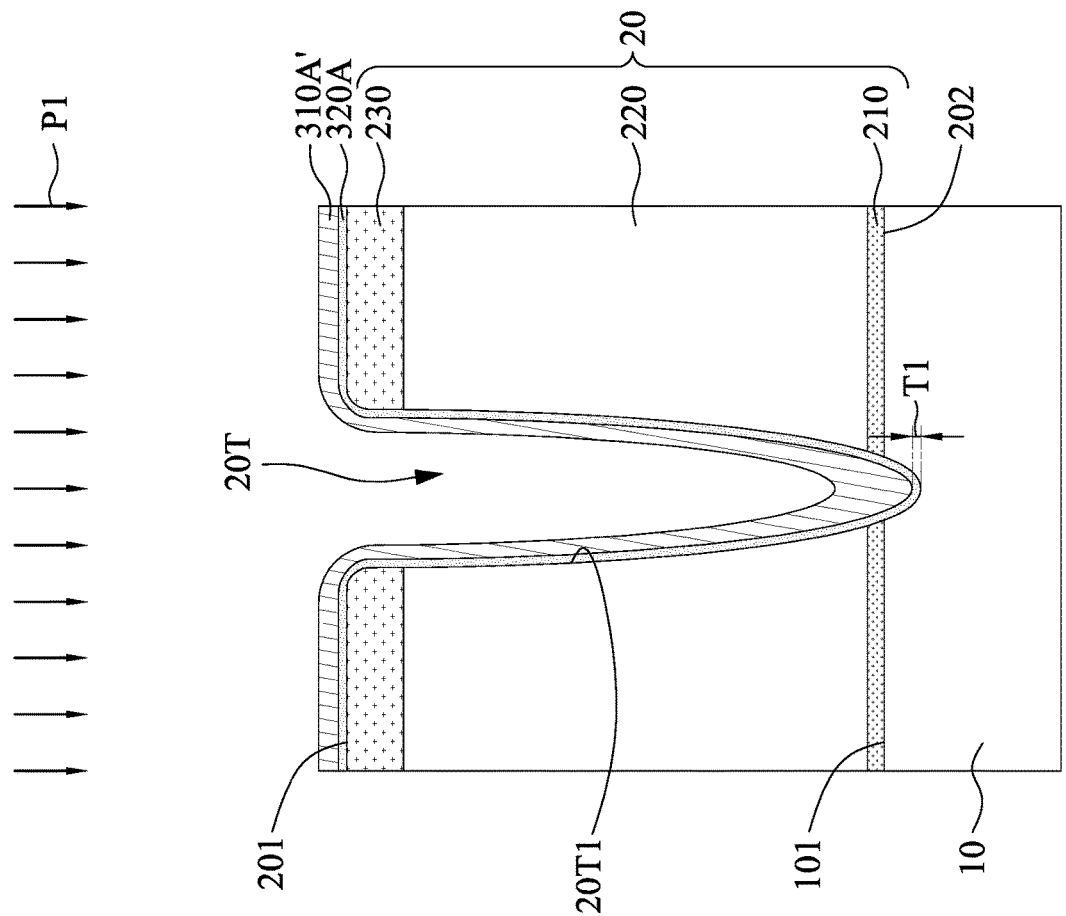
FIG. 4D illustrates one stage of a method of manufacturing a semiconductor structure, in accordance with some embodiments of the present disclosure.

Referring to FIG. 4D, an etching operation P1 may be performed on the conductive material layer 310A to formed a thinned conductive material layer 310A'. In some embodiments, after the conductive material layer 310A is deposited in the trench 20T and over the upper surface 201 of the insulation structure 20, portions of the conductive material layer 310A may be formed directly above the trench 20T and thereby block the opening of the trench 20T. The etching operation P1 may etch away the portions of the conductive material layer 310A directly above the trench 20T to "open up" the trench 20T, and thus the formation of subsequent material layers (e.g., the conductive material layer 310B) inside the trench 20T can be successfully implemented.

Figure 4E:
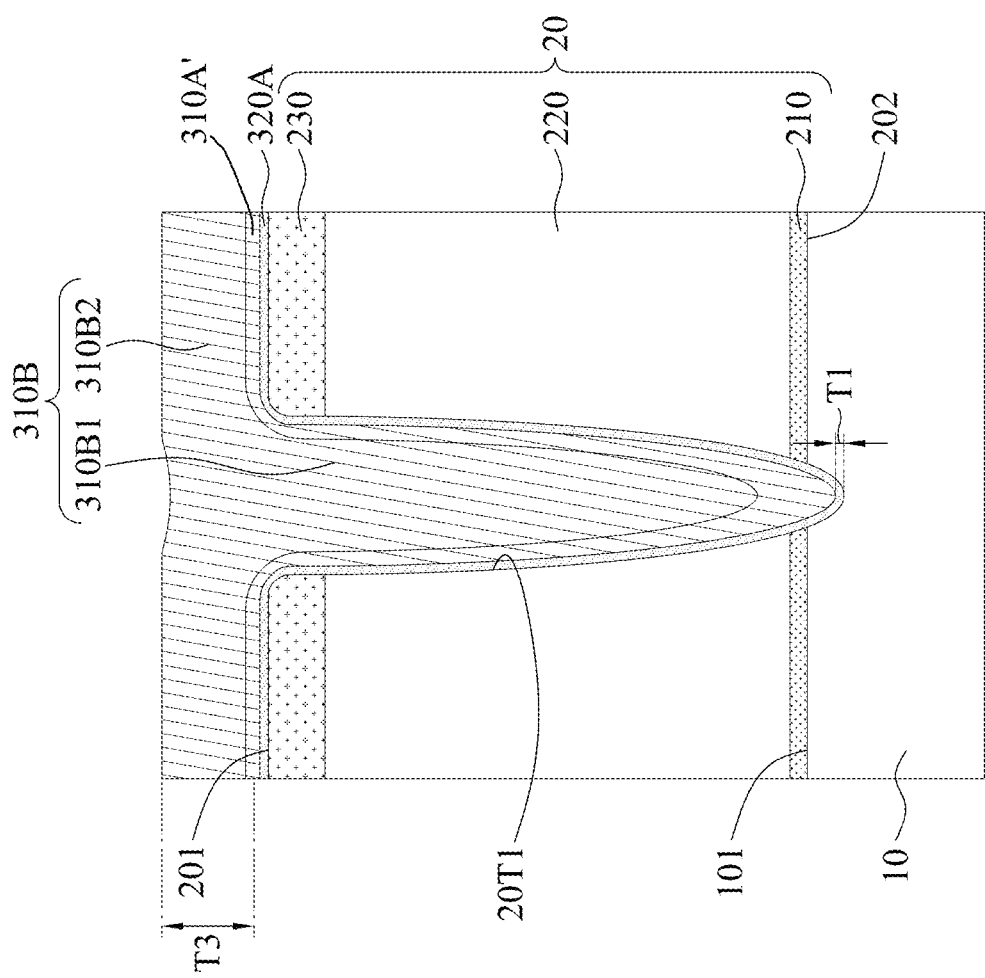
FIG. 4E illustrates one stage of a method of manufacturing a semiconductor structure, in accordance with some embodiments of the present disclosure.

Referring to FIG. 4E, a conductive material layer 310B may be formed in the trench 20T and over the upper surface 201 of the insulation structure 20. In some embodiments, the conductive material layer 310B is formed in the trench 20T and over the titanium nitride layer 320. In some embodiments, the conductive material layer 310B is formed directly on the conductive material layer 310A' in the trench 20T. In some embodiments, the conductive material layer 310B is directly formed on the conductive material layer 310A' after performing the etching operation P1. In some embodiments, the conductive material layer 310B is formed by a chemical vapor deposition (CVD) operation. In some embodiments, the conductive material layer 310B includes a portion 310B1 within the trench 20T and a portion 310B2 over the upper surface 201 of the insulation structure 20.

In some embodiments, the portion 310B2 of the conductive material layer 310B2 over the upper surface 201 of the insulation structure 20 has a thickness T3. In some embodiments, the thickness T3 of the portion 310B2 of the conductive material layer 310B is greater than about half the trench width W1. In some embodiments, the thickness T3 of the portion 310B2 of the conductive material layer 310B is greater than about 0.6 times the trench width W1. In some embodiments, the thickness T3 of the portion 310B2 of the conductive material layer 310B is greater than about 0.7 times the trench width W1. In some embodiments, the thickness T3 of the portion 310B2 of the conductive material layer 310B over the upper surface 201 of the insulation structure 20 is greater than about 23 nm. In some embodiments, the thickness T3 of the portion 310B2 of the conductive material layer 310B is greater than about 31 nm. In some embodiments, the thickness T3 of the portion 310B2 of the conductive material layer 310B is greater than about 33 nm. In some embodiments, the thickness T3 of the portion 310B2 of the conductive material layer 310B is greater than about 36 nm.

In some embodiments, the thickness T3 of the portion 310B2 of the conductive material layer 310B is greater than about three times the thickness T1 of the titanium nitride layer 320A. In some embodiments, the thickness T3 of the portion 310B2 of the conductive material layer 310B is greater than about four times the thickness T1 of the titanium nitride layer 320A. In some embodiments, the thickness T3 of the portion 310B2 of the conductive material layer 310B is greater than about five times the thickness T1 of the titanium nitride layer 320A. In some embodiments, the thickness T3 of the portion 310B2 of the conductive material layer 310B is greater than about eight times the thickness T1 of the titanium nitride layer 320A.

Figure 4F:
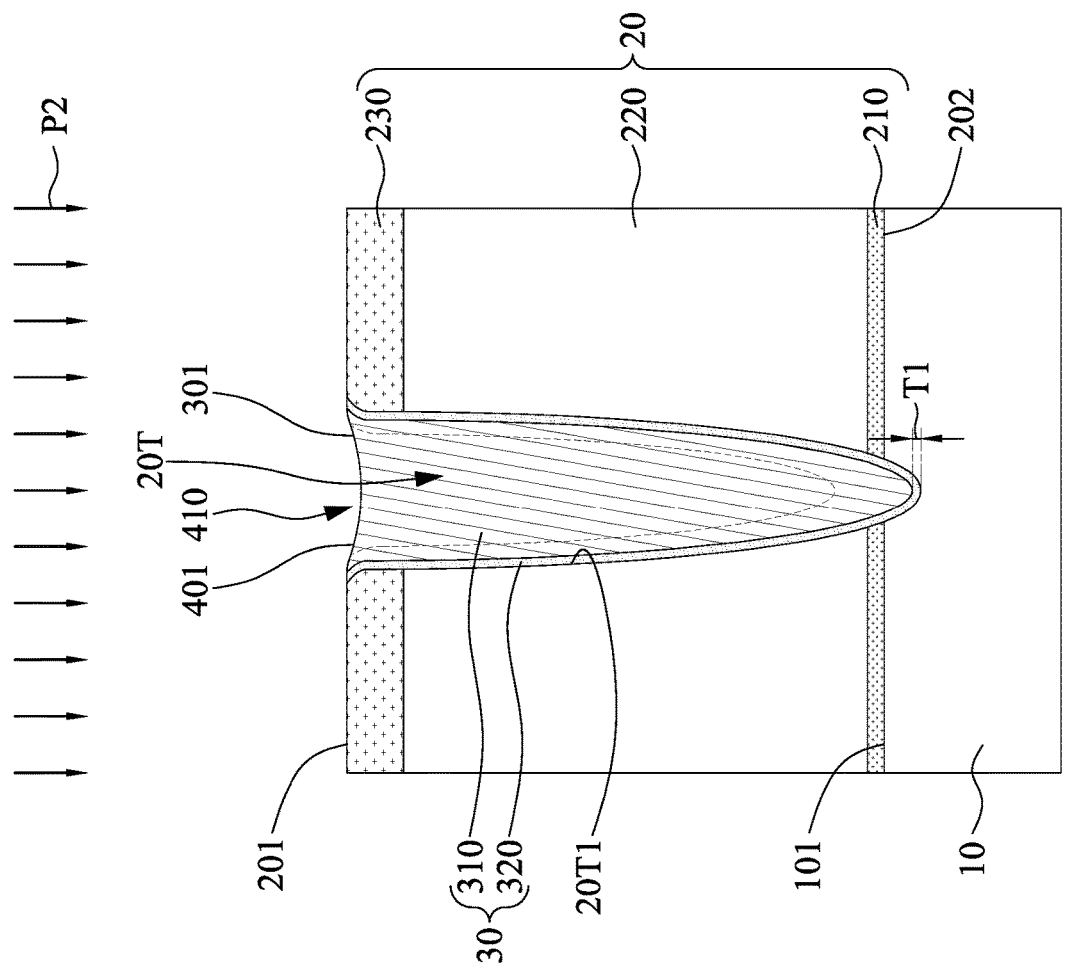
FIG. 4F illustrates one stage of a method of manufacturing a semiconductor structure, in accordance with some embodiments of the present disclosure.

Referring to FIG. 4F, a planarization operation P2 may be performed on the conductive material layer 310B to form a contact plug 30 having a concave upper surface 301 recessed from the upper surface 201 of the insulation structure 20. In some embodiments, the planarization operation P2 may be or include a chemical mechanical polishing (CMP) operation. In some embodiments, a portion of the titanium nitride layer 320A over the upper surface 201 of the insulation structure 20 is fully removed by the CMP operation to form a titanium nitride layer 320 within the trench 20T. In some embodiments, the portion 310B2 of the conductive material layer 310B over the upper surface 201 of the insulation structure 20 is fully removed by the CMP operation P2. In some embodiments, a portion of the conductive material layer 310A' over the upper surface 201 of the insulation structure 20 is fully removed by the CMP operation. As such, a contact plug 30 including the conductive material 310 and the titanium nitride layer 320 is formed within the trench 20T of the insulation structure 20.

Figure 4G:
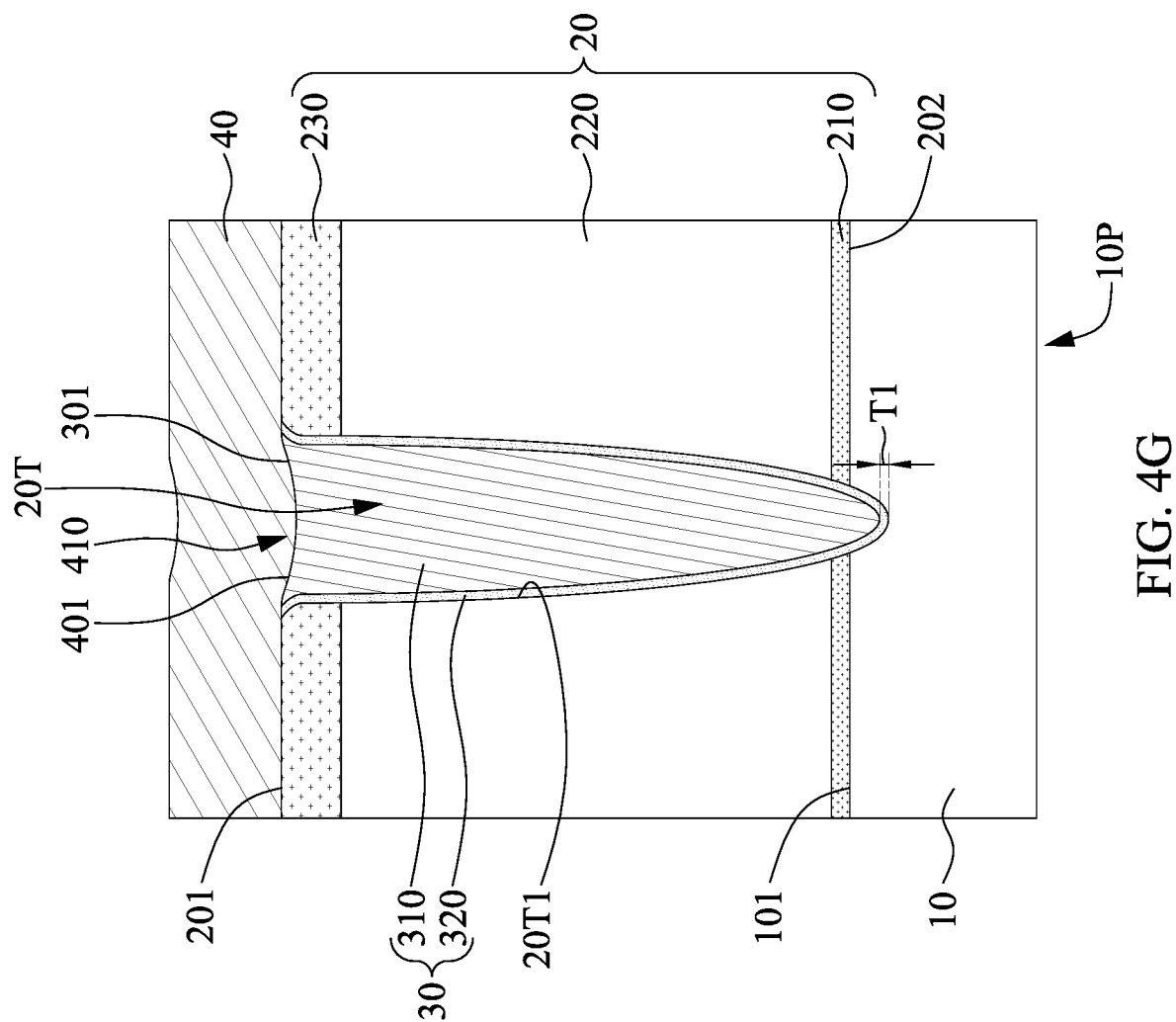
FIG. 4G illustrates one stage of a method of manufacturing a semiconductor structure, in accordance with some embodiments of the present disclosure.

Referring to FIG. 4G, an interconnection layer 40 may be formed directly on the concave upper surface 301 of the contact plug 30. In some embodiments, the interconnection layer 40 is formed by a physical vapor deposition (PVD) operation. In some embodiments, the interconnection layer 40 includes aluminum, copper, tungsten, cobalt, or an alloy thereof.

According to some embodiments of the present disclosure, with the design of the thickness T3 of the portion 310B2 of the conductive material layer 310B over the upper surface 201 of the insulation structure 20, the provided amount of the conductive material layer 310B can be sufficient to sustain the dishing effect caused by the planarization operation P2, and thus the recess extent of the resulted concave upper surface 301 can be minimized. Therefore, a void or a gap which could have been formed between the contact plug 30 and the is interconnection layer 40 due to a deep recess formed on an upper surface of the contact plug 30 can be prevented, and thus a satisfactory electrical connection between the contact plug 30 and the interconnection layer 40 can be achieved.

In addition, in order to enhance the ability to sustain the dishing effect caused by the planarization operation P2 and thereby lower the recess extent of the concave upper surface 301 of the contact plug 30, the thickness T1 of the titanium nitride layer 320A over the upper surface 201 of the insulation structure 20 is usually relatively thick. However, the relatively thickness titanium nitride layer 320 remained in the contact plug 30 undesirably increases the resistance of the contact plug 30. In other words, in order to increase the conductivity or reduce the resistance of the contact plug 30, the thickness T1 of the titanium nitride layer 320 is the less the better. According to some embodiments of the present disclosure, with the design of the thickness T3 of the portion 310B2 of the conductive material layer 310B over the upper surface 201 of the insulation structure 20, the provided amount of the conductive material layer 310B can be sufficient to add support to the relatively thin titanium nitride layer 320A to better sustain the dishing effect caused by the planarization operation P2, and thus the recess extent of the resulted concave upper surface 301 can be minimized. Therefore, a satisfactory electrical connection between the contact plug 30 and the interconnection layer 40 can be further achieved with the contact plug 30 provided with an increased conductivity or a reduced resistance.

Figure 5:
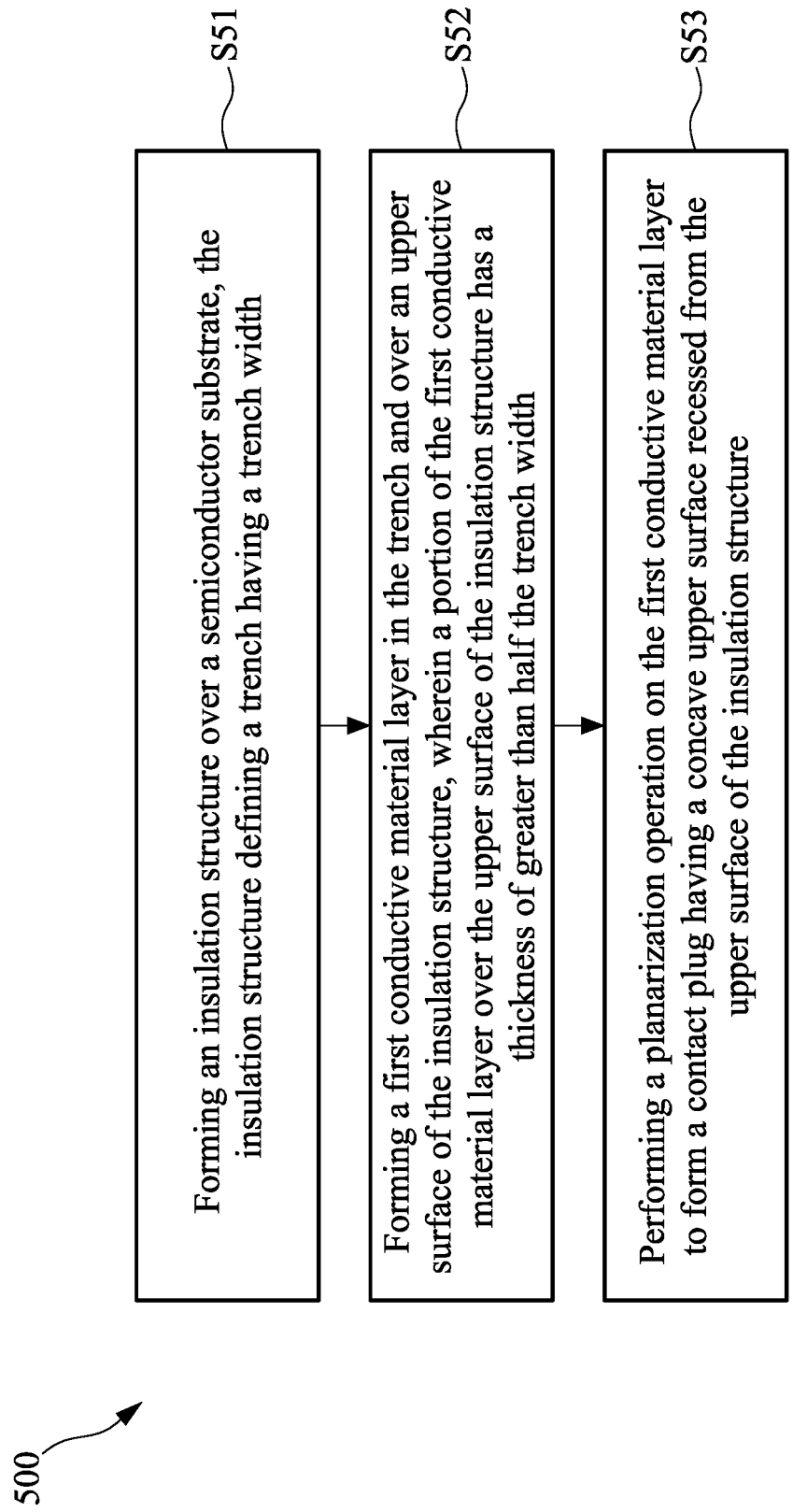
FIG. 5 is a flowchart illustrating a method of manufacturing a semiconductor structure, in accordance with some embodiments of the present disclosure.

FIG. 5 is a flowchart illustrating a method 500 of manufacturing a semiconductor structure, in accordance with some embodiments of the present disclosure.

The method 500 begins with operation S51 in which an insulation structure is formed over a semiconductor substrate. In some embodiments, the insulation structure defines a trench having a trench width.

The method 500 continues with operation S52 in which a first conductive material layer is formed in the trench and over an upper surface of the insulation structure. In some embodiments, a portion of the first conductive material layer over the upper surface of the insulation structure has a thickness of greater than half the trench width.

The method 500 continues with operation S53 in which a planarization operation is performed on the first conductive material layer to form a contact plug having a concave upper surface recessed from the upper surface of the insulation structure.

The method 500 is merely an example, and is not intended to limit the present disclosure beyond what is explicitly recited in the claims. Additional operations can be provided before, during, or after each operations of the method 500, and some operations described can be replaced, eliminated, or moved around for additional embodiments of the method. In some embodiments, the method 500 can include further operations not depicted in FIG. 5. In some embodiments, the method 500 can include one or more operations depicted in FIG. 5.

Figure 6:
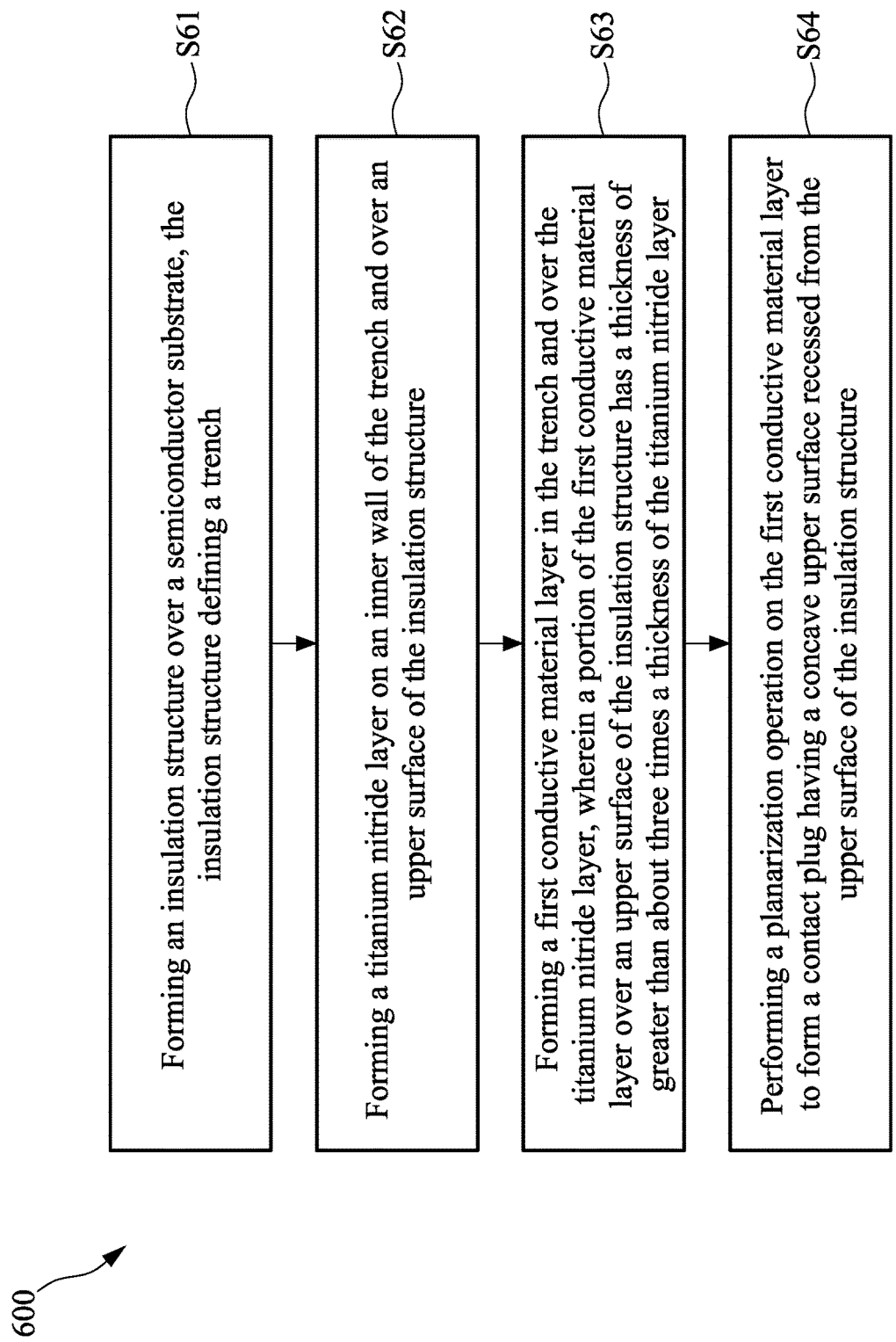
FIG. 6 is a flowchart illustrating a method of manufacturing a semiconductor structure, in accordance with some embodiments of the present disclosure.

FIG. 6 is a flowchart illustrating a method 600 of manufacturing a semiconductor structure, in accordance with some embodiments of the present disclosure.

The method 600 begins with operation S61 in which an insulation structure is formed over a semiconductor substrate. In some embodiments, the insulation structure defines a trench.

The method 600 continues with operation S62 in which a titanium nitride layer is formed on an inner wall of the trench and over an upper surface of the insulation structure.

The method 600 continues with operation S63 in which a first conductive material layer is formed in the trench and over the titanium nitride layer. In some embodiments, a portion of the first conductive material layer over an upper surface of the insulation structure has a thickness of greater than about three times a thickness of the titanium nitride layer.

The method 600 continues with operation S64 in which a planarization operation is performed on the first conductive material layer to form a contact plug having a concave upper surface recessed from the upper surface of the insulation structure.

The method 60 is merely an example, and is not intended to limit the present disclosure beyond what is explicitly recited in the claims. Additional operations can be provided before, during, or after each operations of the method 60, and some operations described can be replaced, eliminated, or moved around for additional embodiments of the method. In some embodiments, the method 60 can include further operations not depicted in FIG. 6. In some embodiments, the method 60 can include one or more operations depicted in FIG. 6.

One aspect of the present disclosure provides a semiconductor structure. The semiconductor structure includes a semiconductor substrate, an insulation structure, a first contact plug, and an interconnection structure. The semiconductor substrate has an upper surface. The insulation structure is over the upper surface of the semiconductor substrate. The first contact plug passes through the is insulation structure and has a concave upper surface recessed from an upper surface of the insulation structure. The interconnection layer directly contacts the concave upper surface of the first contact plug.

Another aspect of the present disclosure provides a method of manufacturing a semiconductor structure. The method includes forming an insulation structure over a semiconductor substrate, the insulation structure defining a trench having a trench width. The method also includes forming a first conductive material layer in the trench and over an upper surface of the insulation structure, wherein a portion of the first conductive material layer over the upper surface of the insulation structure has a thickness of greater than half the trench width. The method further includes performing a planarization operation on the first conductive material layer to form a contact plug having a concave upper surface recessed from the upper surface of the insulation structure.

Another aspect of the present disclosure provides a method of manufacturing a semiconductor structure. The method includes forming an insulation structure over a semiconductor substrate, the insulation structure defining a trench. The method also includes forming a titanium nitride layer on an inner wall of the trench and over an upper surface of the insulation structure. The method further includes forming a first conductive material layer in the trench and over the titanium nitride layer, wherein a portion of the first conductive material layer over an upper surface of the insulation structure has a thickness of greater than about three times a thickness of the titanium nitride layer. The method also includes performing a planarization operation on the first conductive material layer to form a contact plug having a concave upper surface recessed from the upper surface of the insulation structure.

In the method of manufacturing the semiconductor structure, with the design of the thickness of a portion of a conductive material layer over an upper surface of an insulation structure, the provided amount of the conductive material layer can be sufficient to sustain the dishing effect caused by a subsequent planarization operation, and thus the recess extent of the resulted concave upper surface of a contact plug formed of the conductive material layer can be minimized. Therefore, a void or a gap which could have been formed between the contact plug and an interconnection layer due to a deep recess formed on an upper surface of the contact plug can be prevented, and thus a satisfactory electrical connection between the contact plug and the interconnection layer can be achieved.

Although the present disclosure and its advantages have been described in detail, it should be understood that various changes, substitutions and alterations can be made herein without departing from the spirit and scope of the disclosure as defined by the appended claims. For example, many of the processes discussed can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor structure, comprising:
    forming an insulation structure over a semiconductor substrate, the insulation structure defining a trench having a trench width, wherein an opening of the trench is formed at an upper surface of the insulation structure, wherein the trench width is gradually reduced from the upper surface of the insulation structure to a bottom of the trench, wherein the trench is extended through a bottom surface of the insulating structure into the semiconductor substrate;
    forming a titanium nitride layer on an inner wall of the trench;
    forming a second conductive material layer to have a first portion on an inner wall of the titanium nitride layer in the trench and a second portion over the upper surface of the insulation structure;
    performing an etching operation on the second conductive material layer to form a thinned conductive material layer on the inner wall of the titanium nitride layer to open up the trench, wherein the first portion of the second conductive material layer is etched to form a first thinned portion of the thinned conductive material layer on the inner wall of the titanium nitride layer in the trench while the second portion of the second conductive material layer is etched to form a second thinned portion of the thinned conductive material layer over the upper surface of the insulation structure;
    forming a first conductive material layer on the thinned conductive material layer in the trench, wherein the first conductive material layer has a first portion within the trench and a second portion over the upper surface of the insulation structure;
    performing a planarization operation on the titanium nitride layer, the thinned conductive material layer, and the first conductive material layer to remove the second thinned portion of the thinned conductive material layer and the second portion of the first conductive material layer above the upper surface of the insulation structure while the first thinned portion of the thinned conductive material layer and the first portion of the first conductive material layer remain within the trench so as to form a contact plug having a concave upper surface recessed from the upper surface of the insulation structure; and
    forming an interconnection layer directly on the concave upper surface of the contact plug and directly on the upper surface of the insulation structure.

2. The method of claim 1, wherein the trench width of the trench of the insulation structure is greater than about 32 nm, and the thickness of the second portion of the second conductive material layer over the upper surface of the insulation structure is greater than about 23 nm.

3. The method of claim 1, wherein the titanium nitride layer has a first portion formed on the inner wall of the trench and a second portion formed on the upper surface of the insulation structure; and
    wherein the second portion of the titanium nitride layer is removed on the upper surface of the insulation structure during the planarization operation.

4. The method of claim 3, wherein the titanium nitride layer has a thickness of less than about 9 nm.

5. The method of claim 4, wherein the thickness of the titanium nitride layer is equal to or less than about 7 nm.

6. The method of claim 3, wherein the concave upper surface of the contact plug is formed by an upper surface of the first portion of the titanium nitride layer, an upper surface of the first portion of the second conductive material layer, and an upper surface of the first portion of the first conductive material layer.

7. The method of claim 6, wherein a thickness of the second conductive material layer is greater than a thickness of the thinned conductive material layer after the etching operation.

8. The method of claim 7, wherein the second conductive material layer is directly formed on the first conductive material layer after performing the etching operation after the second conductive material is thinned.

9. The method of claim 1, wherein the second conductive material layer is formed by a chemical vapor deposition (CVD) operation, wherein a thickness of the insulation structure remains unchanged after the planarization operation.

10. The method of claim 9, wherein the interconnection layer has a protrusion forming a convex surface in contact with the concave upper surface of the contact plug.

11. The method of claim 10, wherein the interconnection layer is formed by a physical vapor deposition (PVD) operation.

* * * * *